(12) United States Patent
Inagaki et al.

(10) Patent No.: US 7,413,445 B2
(45) Date of Patent: Aug. 19, 2008

(54) ELECTRONIC CONTROL UNIT HAVING WATERTIGHT SEALING AGENT

(75) Inventors: Tatsuya Inagaki, Kariya (JP); Toshio Kohno, Nagoya (JP)

(73) Assignee: JTEKT Corporation, Osaka-shi (JP)

( * ) Notice: Subject to any disclaimer, the term of this patent is extended or adjusted under 35 U.S.C. 154(b) by 0 days.

(21) Appl. No.: 11/526,001

(22) Filed: Sep. 25, 2006

(65) Prior Publication Data

US 2007/0072452 A1  Mar. 29, 2007

(30) Foreign Application Priority Data

Sep. 26, 2005  (JP) ............................. 2005-277337

(51) Int. Cl.
  *H05K 1/00*  (2006.01)
(52) U.S. Cl. ..................... 439/76.1; 439/936
(58) Field of Classification Search ............. 439/76.1, 439/936; 174/521; 361/752
  See application file for complete search history.

(56) References Cited

U.S. PATENT DOCUMENTS

| | | | |
|---|---|---|---|
| 4,131,331 A * | 12/1978 | Kendall, Jr. ................. 439/559 |
| 4,639,056 A * | 1/1987 | Lindeman et al. ............. 439/61 |
| 4,976,634 A * | 12/1990 | Green et al. ................ 439/589 |
| 5,060,113 A * | 10/1991 | Jacobs ....................... 361/721 |
| 5,263,880 A * | 11/1993 | Schwarz et al. .......... 439/733.1 |
| 5,438,160 A * | 8/1995 | Batty ......................... 174/360 |
| 5,483,743 A * | 1/1996 | Armogan et al. .............. 29/883 |
| 5,689,089 A * | 11/1997 | Polak et al. ................. 174/536 |
| 6,297,448 B1 * | 10/2001 | Hara .......................... 174/559 |
| 6,302,738 B1 * | 10/2001 | Tonus ......................... 439/607 |
| 6,434,013 B2 * | 8/2002 | Kitamura et al. ............. 361/752 |
| 7,002,807 B2 * | 2/2006 | Takabatake et al. .......... 361/752 |
| 7,209,360 B1 * | 4/2007 | Yarza ......................... 361/752 |

FOREIGN PATENT DOCUMENTS

JP  2005-150633  6/2005

* cited by examiner

Primary Examiner—Neil Abrams
(74) Attorney, Agent, or Firm—Oblon, Spivak, McClelland, Maier & Neustadt, P.C.

(57) ABSTRACT

An electronic control unit includes an electronic circuit substrate and a casing that accommodates the electronic circuit substrate. A plurality of electronic components are mounted on the electronic circuit substrate. A plurality of connector terminals extend through a side wall of the casing for electrically connecting the electronic circuit substrate to external wires. A retainer portion capable of retaining liquid seal agent is arranged at an inner side of the wall through which the connector terminals extend.

6 Claims, 3 Drawing Sheets

ELECTRONIC CONTROL UNIT HAVING WATERTIGHT SEALING AGENT

CROSS-REFERENCE TO RELATED APPLICATIONS

This application is based upon and claims the benefit of priority from prior Japanese Patent Application No. 2005-277337, filed on Sep. 26, 2005, the entire contents of which are incorporated herein by reference.

BACKGROUND OF THE INVENTION

The present invention relates to an electronic control unit.

A typical electronic control unit includes a casing and an electronic circuit substrate accommodated in the casing. The casing is waterproofed in various ways (see, for example, Japanese Laid-Open Patent Publication No. 2005-150633). Nonetheless, if the electronic control unit is installed in, for example, a vehicle having limited space, it is necessary to further improve the resistance to water of the casing for space efficiency in the vehicle.

More specifically, if the electronic control unit is installed at a position where the casing is likely to be soaked, or completely immersed, in water in certain traveling states of the vehicle, the water resistance of the typical waterproof casing may be insufficient. For example, the water may enter the casing from the interface between the casing and a connector terminal that extends through the casing. Thus, to further increase the water resistance of the casing of the electronic control unit, it is necessary to waterproof the portion in which the connector terminal is provided.

However, the portion in which the connector terminal is installed cannot be sealed by a seal member such as an O-ring, which is used for sealing the gap between the body of the casing and a lid that blocks the opening of the casing. It is thus necessary to apply a liquid seal agent to the basal end of the connector terminal, which extends through a side wall of the casing and projects into the space in the casing. The liquid seal agent is solidified in a raised form using surface tension produced by the seal agent in such a manner that the seal agent is fixed to the basal end of the connector terminal. Such raising (potting) of the seal agent is extremely complicated. Further, it is difficult to form a stable waterproof layer by this procedure.

SUMMARY OF THE INVENTION

Accordingly, it is an objective of the present invention to provide an electronic control unit that ensures improved resistance to water without performing a complicated procedure.

To achieve the foregoing objectives and in accordance with one aspect of the present invention, an electronic control unit is provided. The electronic control unit includes an electronic circuit substrate, a casing, a connector terminal, a seal agent, and a retainer portion. The casing accommodates the electronic circuit substrate and includes a wall. The connector terminal extends through the wall of the casing. The connector terminal is for electrically connecting the electronic circuit substrate to an external wire. The seal agent seals the space between the wall through which the connector terminal extends and the connector terminal in a liquid-tight manner. The retainer portion is provided at an inner side of the wall through which the connector terminal extends and retains the seal agent.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
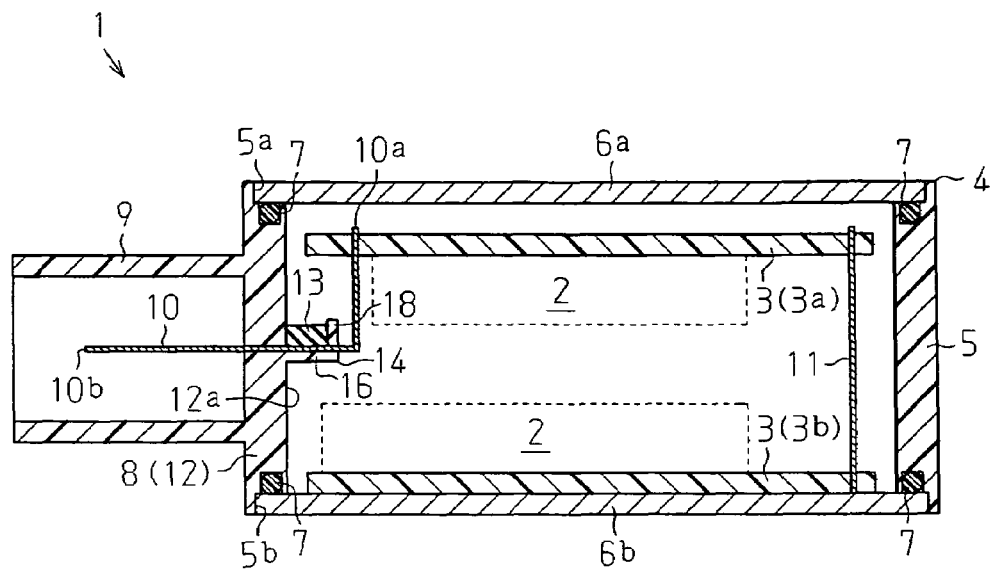
FIG. 1 is a cross-sectional view showing an electronic control unit according to a first embodiment of the present invention.

A first embodiment of the present invention will now be described with reference to FIGS. 1 and 2. As shown in FIG. 1, an electronic control unit 1 of the first embodiment has an electronic circuit substrate 3 and a casing 4 accommodating the electronic circuit substrate 3. A plurality of electronic components 2 are mounted on the electronic circuit substrate 3. In this embodiment, the casing 4 has a casing body 5 having a flat cylindrical shape and a pair of plate-like lids 6a, 6b. The lid 6a and the lid 6b close an opening 5a and an opening 5b, respectively, which are defined in the casing body 5. A seal member 7 is provided between each of the lids 6a, 6b and a wall of the corresponding one of the openings 5a, 5b. The seal member 7 seals the space between the corresponding lid 6a, 6b and the associated opening 5a, 5b in a liquid-tight manner.

A substantially cylindrical connector portion 9 projects from a side wall 8 of the casing 4. A wire harness (not shown) is connected to the casing 4 through the connector portion 9. A plurality of connector terminals 10 are formed in the connector portion 9, extending through the side wall 8 from which the connector portion 9 projects. Each of the connector terminals 10 extends from the connector portion 9 into the interior of the casing 4 and has an end 10a arranged in the casing 4. The end 10a of each connector terminal 10 is connected to the electronic circuit substrate 3, which is accommodated in the casing 4. Therefore, when the wire harness is connected to the connector portion 9, external wires (not shown) from the wire harness are connected to ends 10b of the connector terminals 10 in the connector portion 9. This electrically connects the external wires to the electronic circuit substrate 3.

The electronic circuit substrate 3 has a double-layered structure formed by two substrate sections 3a, 3b that are connected together through a connection terminal 11. The substrate sections 3a, 3b extend parallel with the lids 6a, 6b of the casing 4. A portion of each connector terminal 10 in the vicinity of the end 10a, which is located in the casing 4, is bent toward the substrate section 3a in an L-shaped manner. In this manner, the connector terminals 10 are connected to the substrate section 3a. In the first embodiment, the lids 6a, 6b of the casing 4 are made of metal exhibiting increased heat radiation performance. Accordingly, when held in contact with the corresponding substrate section 3a, 3b, each lid 6a, 6b functions as a heat sink that releases heat from the electronic components 2, which are mounted on the substrate sections 3a, 3b, to the exterior of the casing 4.

Figure 2:
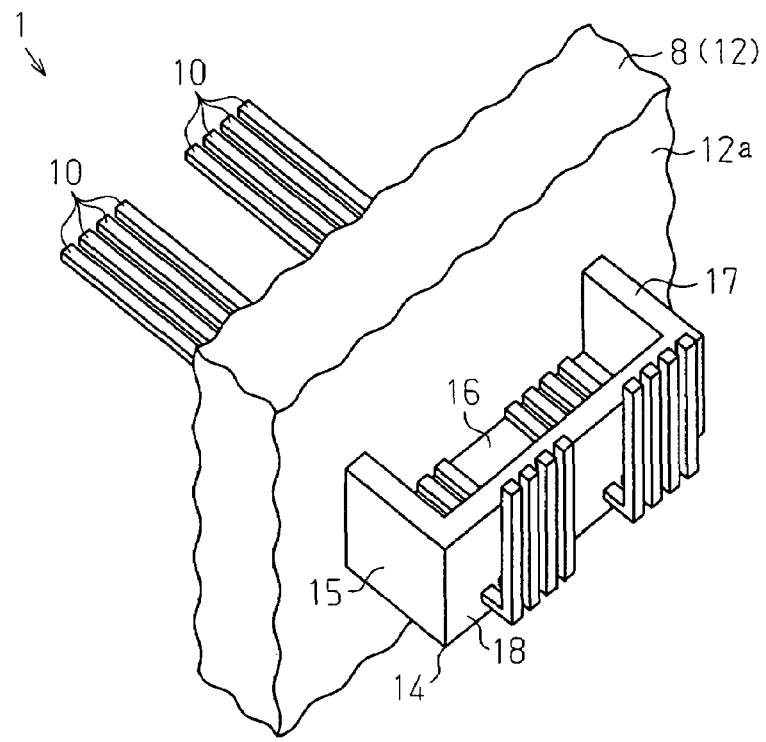
FIG. 2 is a perspective view showing a retainer portion.

In the first embodiment, referring to FIGS. 1 and 2, a retainer portion 14 is provided at an inner side of the side wall 8 (a connector terminal support wall 12) through which the connector terminals 10 extend. The retainer portion 14 is capable of retaining a liquid seal agent 13. Specifically, the retainer portion 14 has a plurality of side walls 15, 16, 17 and an end wall 18 that connects the distal ends of the side walls 15 to 17 together. Each of the side walls 15 to 17 extends from an inner side 12a of the connector terminal support wall 12 in the extending direction of each connector terminal 10, in such a manner that the side walls 15 to 17 and the connector terminal 10, which project into the casing 4, extend substantially parallel with one another. The side walls 15 to 17 are arranged around portions of the connector terminals 10 other than the portions at the side corresponding to the opening 5a of the casing body 5. The end wall 18 extends substantially parallel with the connector terminal support wall 12. In other words, the retainer portion 14 of the first embodiment has an opening facing the opening 5a of the casing body 5. Therefore, the seal agent 13 is provided in the retainer portion 14 through the opening 5a.

In the first embodiment, the seal agent 13 is a silicone type seal agent and hardens similar to rubber as time elapses. Each of the connector terminals 10 is formed integrally with the casing body 5 and the retainer portion 14 through insert molding. The connector terminals 10 extend through the end wall 18 and are bent toward the substrate section 3a.

The first embodiment has the following advantages.

(1) The retainer portion 14 is provided at the inner side of the side wall 8 (the connector terminal support wall 12) through which the connector terminals 10 extend. The retainer portion 14 retains the seal agent 13, which is liquid. The seal agent 13 is thus applied to the portion in which the connector terminals 10 are installed in a liquid-tight manner simply by providing the seal agent 13 in the retainer portion 14. This makes it unnecessary to solidify the seal agent 13 in a raised manner, which is complicated. Accordingly, a stable waterproof layer is easily and reliably formed between the connector terminals 10 and the connector terminal support wall 12, or a wall of the casing 4. This improves the water resistance of the electronic control unit 1.

(2) The opening of the retainer portion 14 faces the opening 5a of the casing body 5. The seal agent 13 is thus provided in the retainer portion 14 directly through the opening 5a. This simplifies application of the seal agent 13.

Figure 3:
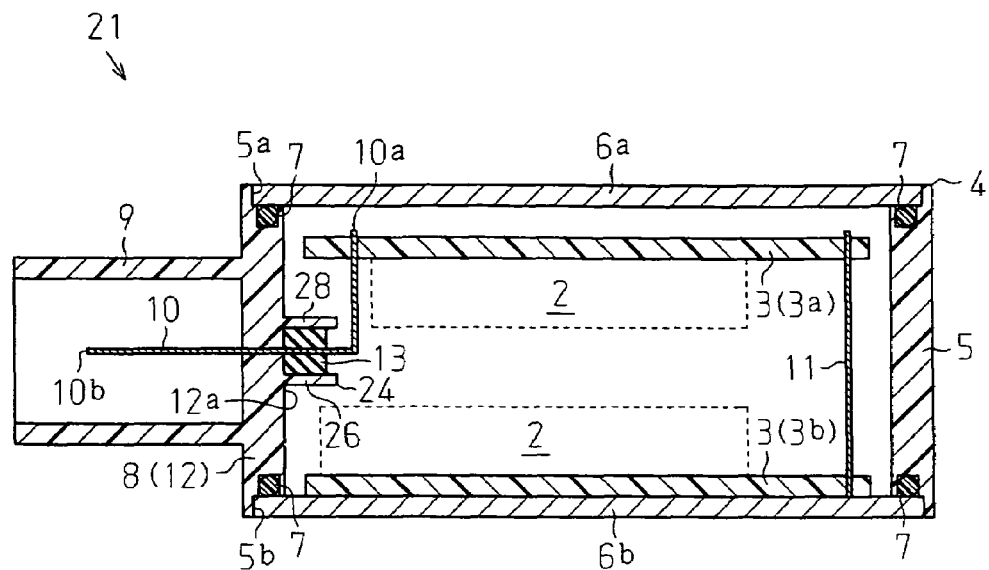
FIG. 3 is a cross-sectional view showing an electronic control unit according to a second embodiment of the present invention.
Figure 4:
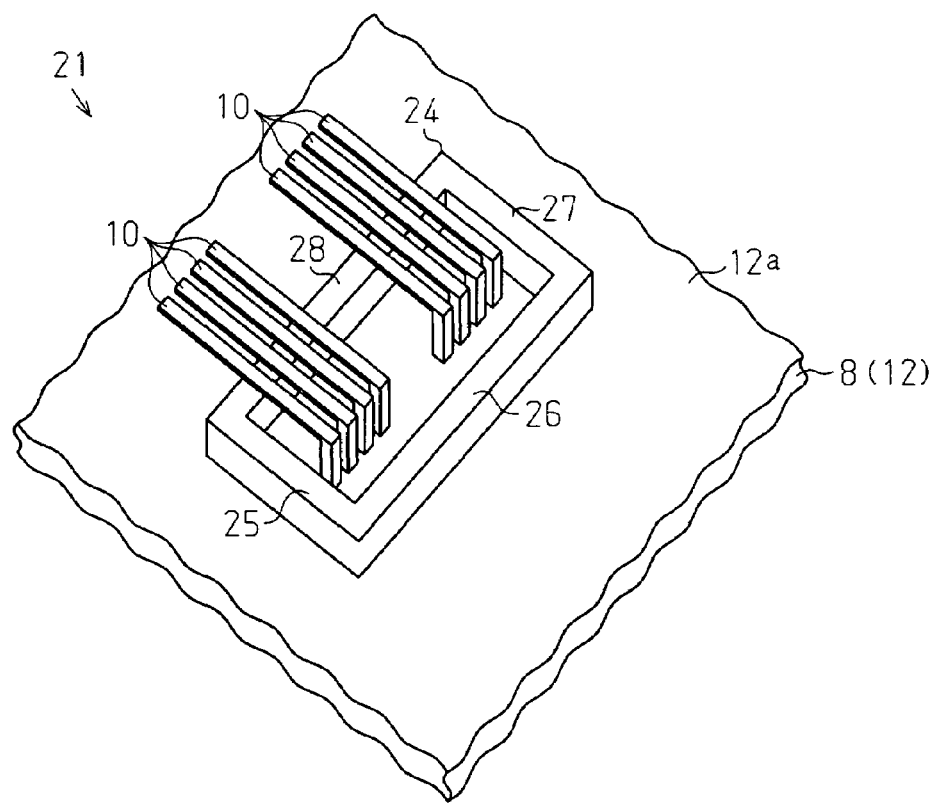
FIG. 4 is a perspective view showing a retainer portion.

A second embodiment of the present invention will hereafter be explained with reference to FIGS. 3 and 4. As shown in the drawings, an electronic control unit 21 of the second embodiment has a retainer portion 24 configured differently from the retainer portion 14 of the first embodiment. The remainder of the second embodiment is identical with the corresponding portions of the first embodiment. Therefore, same or like reference numerals are given to parts of the second embodiment that are the same as or like corresponding parts of the first embodiment.

In the second embodiment, the retainer portion 24 includes a plurality of side walls 25, 26, 27, 28. Each of the side walls 25 to 28 projects from the inner side 12a of the connector terminal support wall 12 in the extending direction of each connector terminal 10. The side walls 25 to 28 thus extend substantially parallel with the connector terminals 10 and are arranged around the connector terminals 10. That is, the side walls 25, 26, 27 of the retainer portion 24 correspond to the side walls 15, 16, 17 of the retainer portion 14 of the first embodiment, respectively. Further, the retainer portion 24 of the second embodiment includes the side wall 28 arranged at the side corresponding to the opening 5a of the casing body 5. The retainer portion 24 has an opening defined at a position corresponding to the position of the end wall 18 of the retainer portion 14 of the first embodiment. That is, the opening of the retainer portion 24 faces in the extending direction of each connector terminal 10. Also, the inner peripheral surface of the retainer portion 24 (except for the inner side 12a of the connector terminal support wall 12) is, or the inner sides of the walls 25 to 28 are, provided without contacting the connector terminals 10. To form a waterproof layer in the portion in which the connector terminals 10 are installed, the seal agent 13 is provided in the retainer portion 24 with the connector portion 9 facing downward (in the direction in which gravity acts), as illustrated in FIG. 4.

The second embodiment has the following advantages.

(1) The inner peripheral surface of the retainer portion 24 does not contact the connector terminals 10. This prevents a small empty gap from being provided in a contact portion between any one of the connector terminals 10 and the inner peripheral surface of the retainer portion 24. This ensures improved resistance to water of the electronic control unit 21.

(2) The retainer portion 24 has the side walls 25 to 28 that project from the inner side 12a of the connector terminal support wall 12 in the extending direction of each connector terminal 10. The side walls 25 to 28 extend substantially parallel with the connector terminals 10 projecting into the casing 4 and are arranged around the connector terminals 10. The opening of the retainer portion 24 faces in the extending direction of each connector terminal 10. The connector terminals 10 are thus easily prevented from contacting the inner peripheral surface of the retainer portion 24.

The present invention may be embodied in the following modified forms.

Although the opening of the retainer portion 14 of the first embodiment faces the opening 5a of the casing body 5, the opening may face the opening 5b, or in the opposite direction. Further, in a casing having an opening facing in the extending direction of each connector terminal 10, the opening of the retainer portion 14 may face in the extending direction of the connector terminal 10, as in the retainer portion 24 of the second embodiment.

Figure 5:
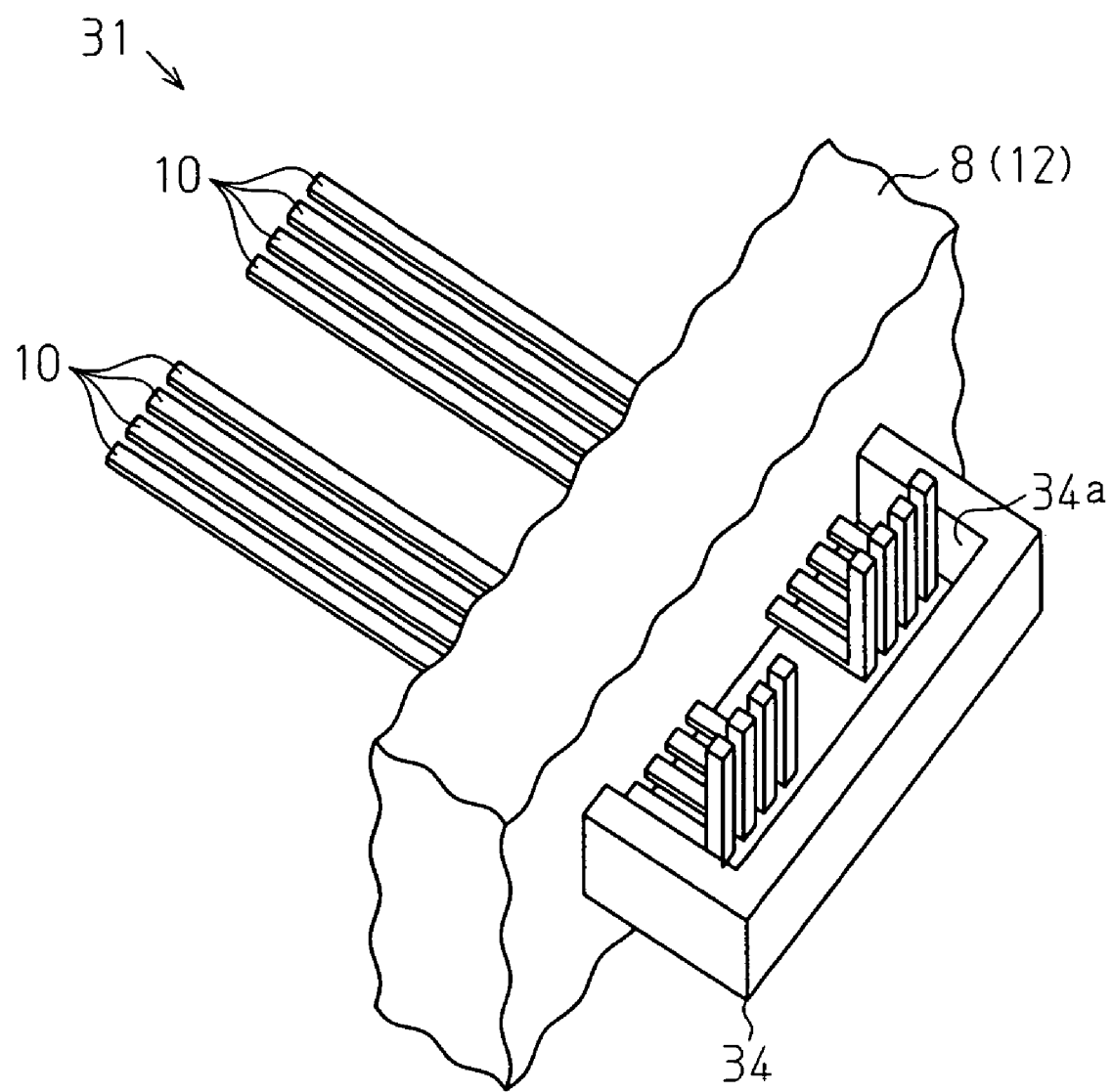
FIG. 5 is a perspective view showing a modification of the retainer portions.

In the second embodiment, the opening of the retainer portion 24 faces in the extending direction of each connector terminal 10, thus preventing the inner peripheral surface of the retainer portion 24 from contacting the connector terminals 10. However, as in a retainer portion 34 of an electronic control unit 31 of FIG. 5, even if an opening of the retainer portion 34 faces in the bending direction of each connector terminal 10 like the first embodiment, an inner peripheral surface 34a (except for the inner side 12a of the connector terminal support wall 12) can be prevented from contacting the connector terminals 10.

In each of the first and second embodiments, the casing 4 includes the flat cylindrical casing body 5 and the plate-like lids 6a, 6b, which close the openings 5a, 5b of the casing body 5. However, the casing 4 may be shaped in any other suitable manner. Further, the position of the connector portion 9 is not restricted to the position of FIG. 1. The connector portion 9 may be formed in, for example, the lids 6a, 6b.

The invention claimed is:

1. An electronic control unit comprising:
  an electronic circuit substrate;
  a liquid tight casing that accommodates the electronic circuit substrate therein, wherein the liquid tight casing includes a casing wall and a lid mounted to an opening of the casing in a liquid tight manner;

a connector terminal that extends through the wall of the casing in an extending direction, and is connected to the electronic circuit substrate for electrically connecting the electronic circuit substrate to an external wire;

a retainer portion freely extending from an inner side of the casing wall through which the connector terminal extends, wherein the retainer portion comprises a plurality of retainer portion walls extending parallel to the extending direction, and a retainer portion wall extending transverse to the extending direction, to form a cavity having an opening facing the opening of the liquid tight casing, wherein the connector terminal extends through the cavity; and a sealing agent in the cavity for sealing a space between the connector terminal and the casing wall in a liquid-tight manner.

2. The electronic control unit according to claim 1, wherein the connector terminal further extends through the retainer portion wall extending transverse to the extending direction.

3. The electronic control unit according to claim 1, further comprising a seal element provided between the casing wall and the lid.

4. The electronic control unit according to claim 2, further comprising a seal element provided between the casing wall and the lid.

5. The electronic control unit according to claim 1, further comprising a connector portion accommodating the connector terminal, wherein the connector terminal is integrally formed with the casing wall.

6. The electronic control unit according to claim 2, further comprising a connector portion accommodating the connector terminal, wherein the connector terminal is integrally formed with the casing wall.

* * * * *